United States Patent
Liu et al.

(10) Patent No.: US 6,576,514 B2
(45) Date of Patent: Jun. 10, 2003

(54) METHOD OF FORMING A THREE-DIMENSIONAL POLYSILICON LAYER ON A SEMICONDUCTOR WAFER

(75) Inventors: Chen-Chin Liu, Yun Lin-Hsien (TW); Chin-Yi Huang, Hsin-Chu Hsien (TW); Weng-Hsing Huang, Hsin-Chu (TW)

(73) Assignee: Macronix International Co. Ltd., Hsin-Chu (TW)

( * ) Notice: Subject to any disclaimer, the term of this patent is extended or adjusted under 35 U.S.C. 154(b) by 0 days.

(21) Appl. No.: 09/683,213

(22) Filed: Dec. 3, 2001

(65) Prior Publication Data

US 2002/0055226 A1 May 9, 2002

Related U.S. Application Data

(62) Division of application No. 09/707,991, filed on Nov. 8, 2000, now abandoned.

(51) Int. Cl.⁷ .............................. H01L 21/336
(52) U.S. Cl. ................ 438/259; 438/201; 438/211; 438/257
(58) Field of Search .................. 438/201, 211, 438/229, 230, 396, 692, 592–593, 257, 259

(56) References Cited

U.S. PATENT DOCUMENTS

6,248,631 B1 * 6/2001 Huang et al. ............... 438/260
6,458,660 B1 * 10/2002 Chang et al. ............... 438/263

* cited by examiner

Primary Examiner—George Fourson
Assistant Examiner—Thanh V Pham
(74) Attorney, Agent, or Firm—Winston Hsu

(57) ABSTRACT

A semiconductor wafer includes a substrate, a polysilicon layer, and a sacrificial layer on the polysilicon layer. A dielectric layer is formed to cover the substrate and the sacrificial layer. A portion of the dielectric layer is removed to expose an upper portion of the sidewalls of the sacrificial layer. A passivation layer is formed on the surface of the dielectric layer and contacts the exposed sidewalls of the sacrificial layer. The passivation layer and the dielectric layer positioned over the sacrificial layer are removed down to a predetermined height by CMP. The dielectric layer is removed from the sacrificial layer, followed by removing the passivation layer and removing the sacrificial layer. A recess is thus formed with the polysilicon layer as the bottom of the recess and the remaining dielectric layer as the walls. Finally, another polysilicon layer is formed on the semiconductor wafer to form a floating gate.

14 Claims, 16 Drawing Sheets

METHOD OF FORMING A THREE-DIMENSIONAL POLYSILICON LAYER ON A SEMICONDUCTOR WAFER

BACKGROUND OF INVENTION

1. Field of the Invention

The present invention relates to a method of forming a polysilicon layer on a semiconductor wafer, and more particularly, to a method of forming a three-dimensional polysilicon layer on a semiconductor wafer.

2. Description of the Prior Art

In semiconductor application, a non-volatile memory such as an erasable and programmable read only memory (EPROM), electrically erasable programmable read only memory ($E^2$ PROM) and flash memory all store data in the memory whether an electrical power is supplied or not, and read and write data through controlling a threshold voltage of a control gate. The structure of the non-volatile memory is designed as a stack-gate. The stack-gate comprises a floating gate for storing charge, an ONO (oxide-nitride-oxide) dielectric layer and a control gate for reading and writing of the data. Like a capacitor storing data, the memory store charge in the stack-gate for representing the data "1" and erase the charge from the stack-gate for representing the data "0". Additionally, the data storing in the memory is renewed through applying an extra energy to the stack-gate.

Please refer to FIG. 1 to FIG. 4. FIG. 1 to FIG. 4 are cross-sectional diagrams of forming a stack-gate 36 according to the prior art. The method of forming the stack-gate 36 on a semiconductor wafer 10 is forming a twin cell gate on the semiconductor wafer 10. The semiconductor wafer 10 comprises a silicon substrate 12, two field oxide 14 positioned on the substrate 12, two gate oxide layer 16 positioned in a predetermined area between the field oxide 14, two polysilicon layer 18 positioned on the gate oxide layer 16 and two silicon nitride layer 20 positioned on the polysilicon layer 18, as shown in FIG. 1.

According to the prior art, an ion implantation process is performed to implant ion on the surface of the substrate 12 that is not covered by the gate oxide layer 16 and the field oxide 14. A thermal oxidation process is then performed to diffuse the ion into a predetermined depth and form three ion implantation layer 22 serving as a buried drain or a source. The thermal oxidation process also grows a thermal oxide layer 24 on the ion implantation layer 22 to form a buried drain and a buried source (BD/BS) on the surface of the substrate 12, as show in FIG. 2. The silicon nitride layer 20 is then totally removed and two polysilicon layer 26 are formed in a predetermined area on the surface of the semiconductor wafer 10. Each polysilicon layer 18 together with the polysilicon layer 26 on the polysilicon layer 18 form a three-dimensional polysilicon layer 28 serving as a floating gate of a non-volatile memory, as shown in FIG. 3.

Please refer to FIG. 4. A dielectric layer 30 is formed on the surface of the floating gate and a polysilicon layer 32 is then formed on the surface of the semiconductor wafer 10. The polysilicon layer 32 serves as a control gate of the stack-gate and covers the surface of both the dielectric layer 30 and the thermal oxide layer 24. The dielectric layer 30 is an ONO structure that comprises a native oxide as a first oxide layer, a nitride layer positioned on the first oxide layer and a second oxide layer positioned on the nitride layer.

The floating gate, the dielectric layer 30 and the control gate together constitute the stack-gate 36 of the non-volatile memory. The two stack-gates 36 between the filed oxide 14 form the twin cell gate. When a high voltage is applied on the control gate of the stack-gate, the drain generates hot electrons due to the carrier multiplication. Some of the hot electrons transverse through the gate oxide layer 16 into the floating gate. The floating gate is charged and the data is written into the stack-gate. Because the dielectric layer 30 and the gate oxide layer 16 are insulated, the charge provided by the hot electrons is trapped in the floating gate.

According to the prior art, the thermal oxide layer 24, that serves as the BD/BS, is formed on the surface of the substrate 12 by performing a thermal oxidation process. Because the restriction of the field oxide 14, the thickness of the thermal oxide layer 24 is not uniform, the thermal oxide layer 24 forms a bird peak, the lattice structure of the substrate 12 is damaged, and the reliability of the stack-gate 36 is dramatically reduced. Additionally, because the thermal oxidation process overly diffuses the ion in the drain and source, the channel length under the stack-gate 36 is relatively shorten. This causes an occurrence of a punch through between the source and the drain, influences the electrical performance of the stack-gate 36 and reduces the yield rate of the semiconductor product.

SUMMARY OF INVENTION

It is therefore a primary objective of the present invention to provide a method of forming a three-dimensional polysilicon layer to construct a stack-gate of a non-volatile memory.

According to the claimed invention, a semiconductor wafer is provided, the semiconductor wafer including a substrate, a first polysilicon layer having an approximately rectangular cross-section positioned on the substrate, and a sacrificial layer positioned on the first polysilicon layer. A dielectric layer is formed to cover the substrate and the sacrificial layer. A portion of the dielectric layer is removed to expose an upper portion of the sidewalls of the sacrificial layer. Following this, a passivation layer is formed on the surface of the dielectric layer and contacts the exposed sidewalls of the upper portion of the sacrificial layer. Then, both the passivation layer and the dielectric layer positioned over the sacrificial layer are removed down to a predetermined height by CMP. The dielectric layer is removed from the sacrificial layer followed by removing the passivation layer from the surface of the semiconductor wafer and removing the sacrificial layer from the first polysilicon layer. As a result, a recess is formed using the first polysilicon layer as the bottom of the recess and using the remaining dielectric layer as the walls of the recess. Finally, a second polysilicon layer is formed on the semiconductor wafer to form a floating gate. Since the surface of the second polysilicon layer follows the shape of the recess to form a three-dimensional structure, a contact area between an ONO dielectric layer and a control gate forming on the floating gate in a later process is increased to raise the coupling ratio of the floating gate.

It is an advantage of the present invention that a stack-gate, composing of the floating gate, the ONO dielectric layer and the control gate, has three-dimensional structure, to increase the contact area between the ONO dielectric layer and the control gate and thus raise the gate coupling ration of the stack-gate to 60~75%. Additionally, the passivation layer is formed on the surface of the dielectric layer to ensure the thickness of the dielectric layer around the first polysilicon layer and the channel length of the stack-gate being controlled. Thus, the size of the devices is effectively shrunk and the reliability of the devices is greatly improved.

DETAILED DESCRIPTION

Figure 1:
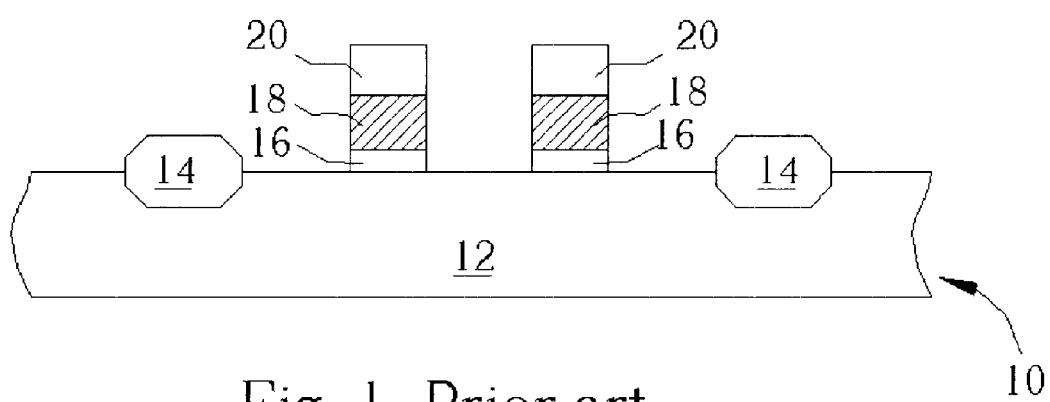
FIG. 1 to FIG. 4 are cross-sectional diagrams of forming a stack-gate according to the prior art.
Figure 2:
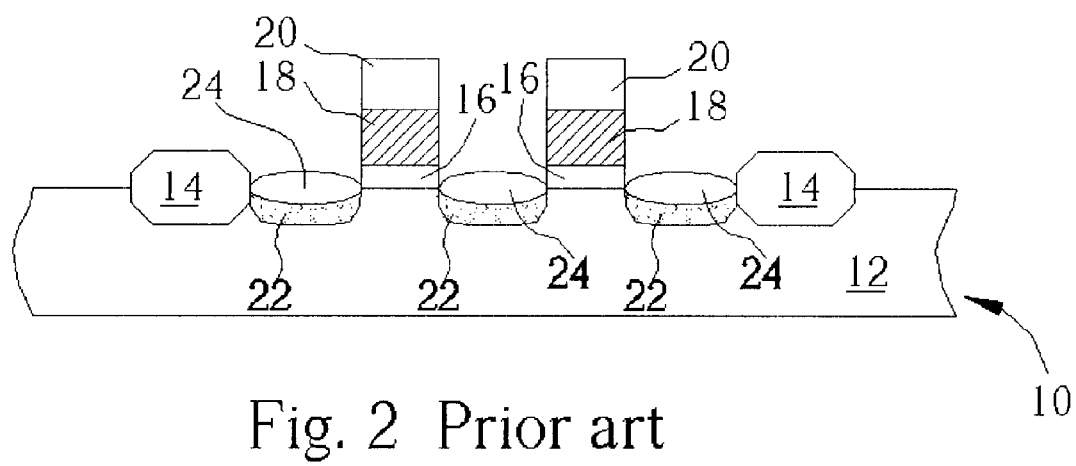
Figure 3:
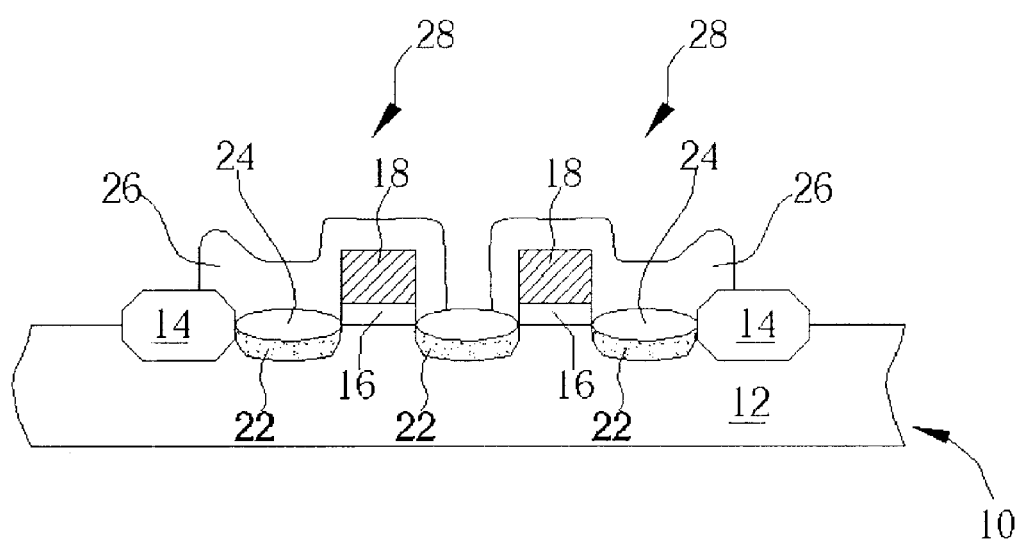
Figure 4:
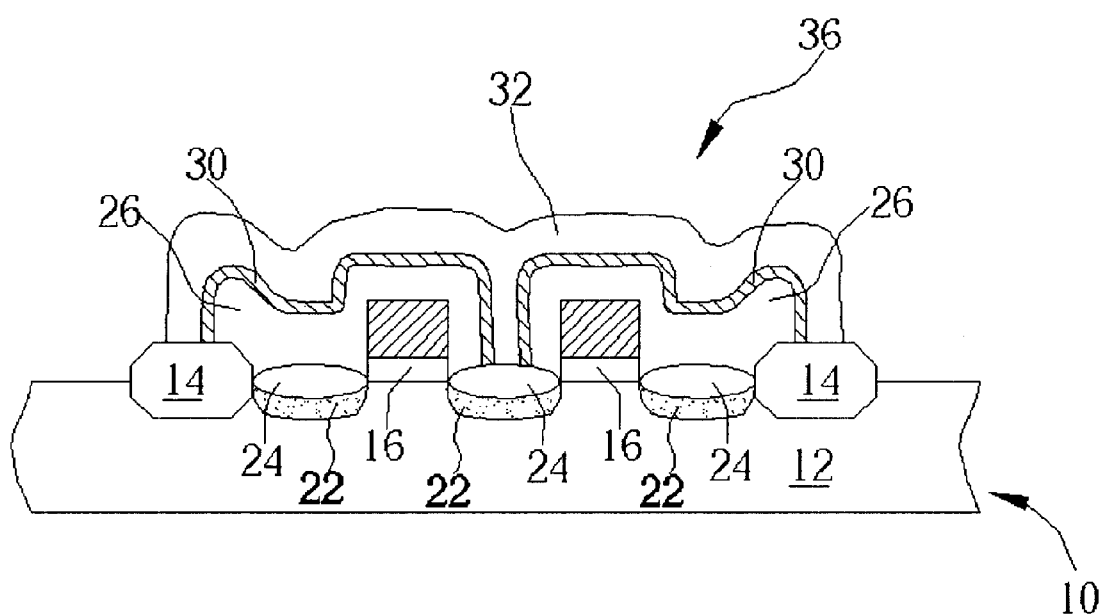
Figure 5:
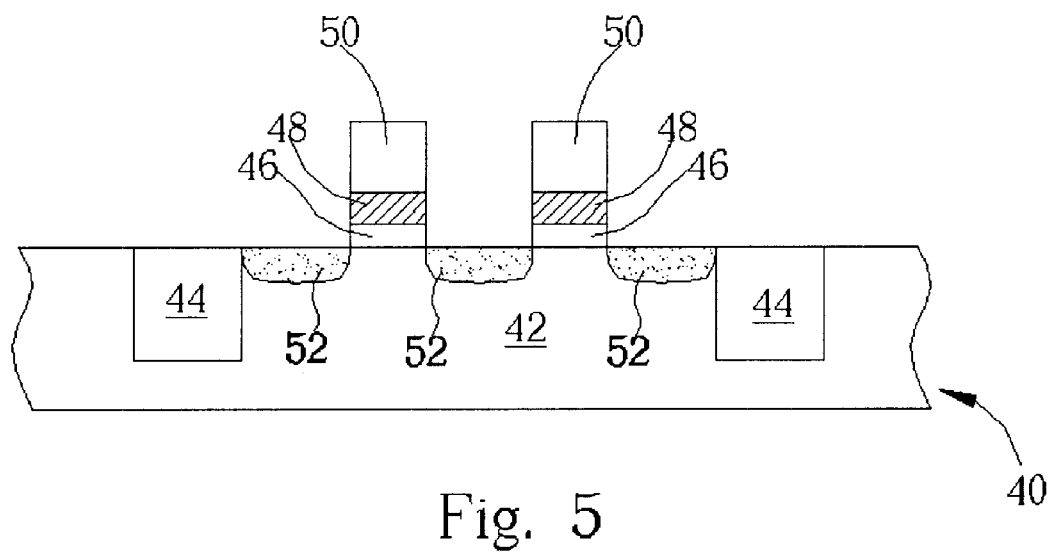
FIG. 5 to FIG. 9 are cross-sectional diagrams of forming a three-dimensional polysilicon layer according to the present invention.
Figure 6:
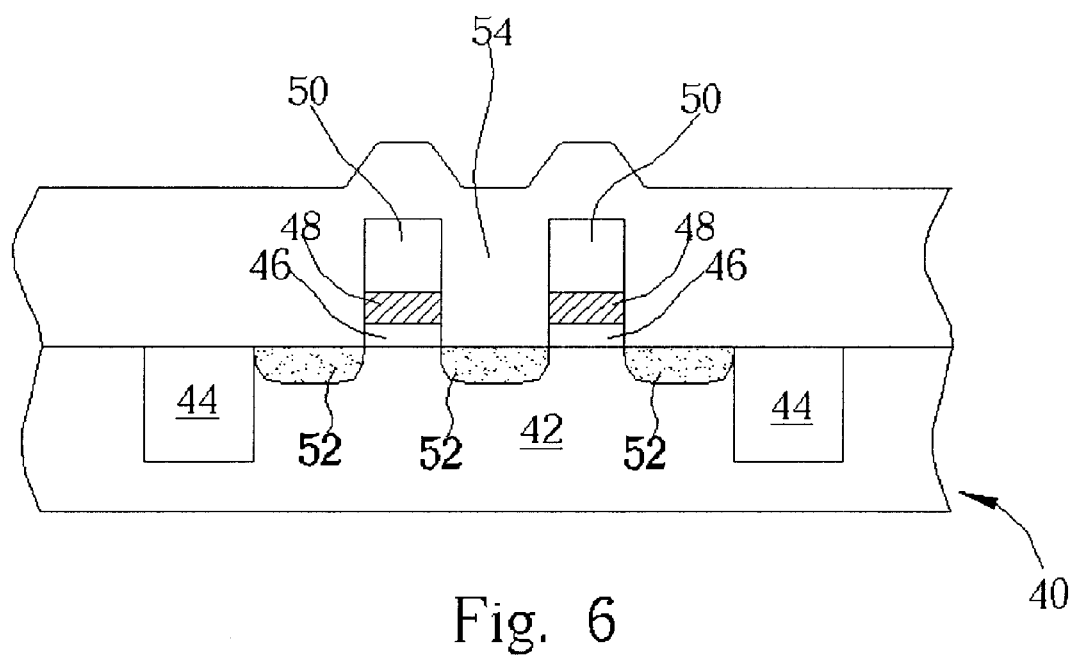

Please refer to FIG. 5 to FIG. 9. FIG. 5 to FIG. 9 are cross-sectional diagrams of forming a three-dimensional polysilicon layer 60 on according to the present invention. The present invention provides a method of forming a three-dimensional polysilicon layer 60 on a semiconductor wafer 40, the polysilicon layer 60 serves as a floating gate of a non-volatile memory. The semiconductor wafer 40 comprises a substrate 42, two field oxide 44 positioned on the substrate 42, two gate oxide layer 46 positioned in a predetermined area on the surface of the substrate 42, two polysilicon layer 48 positioned on the surface of each gate oxide layer 46, two sacrificial layer 50 positioned on each polysilicon layer 48, and a doped areas 52 adjacent to each side of the polysilicon layer 48, as shown in FIG. 5. The polysilicon layer 48 has an approximately rectangular cross-section. The doped areas 52 serve as a drain and a source of the floating gate. The substrate 42 is formed of silicon and the sacrificial layer 50 is formed of silicon nitride.

Figure 7:
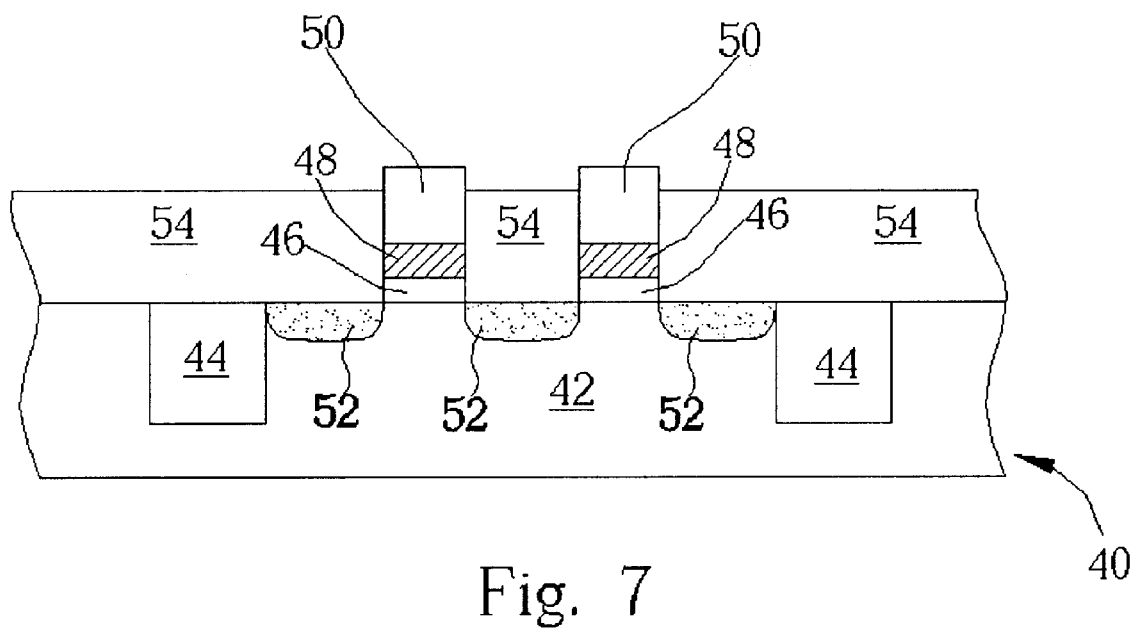

According to the present invention, a dielectric layer 54 is formed of silicon oxide on the surface of the semiconductor wafer 40 by performing a high-density plasma chemical vapor deposition (HDP CVD) process. The dielectric layer 54 covers the substrate 42 and the sacrificial layer 50 and the top surface of the dielectric layer 54 on the surface of the substrate 42 is above the top surface of the sacrificial layer 50, as shown in FIG. 5. A chemical mechanical polishing (CMP) process is then performed to remove the dielectric layer 54 from the top surface of the sacrificial layer 50 and to remove a predetermined thickness from the top portion of the dielectric layer 54 on the surface of the substrate 42, as shown in FIG. 7.

Figure 8:
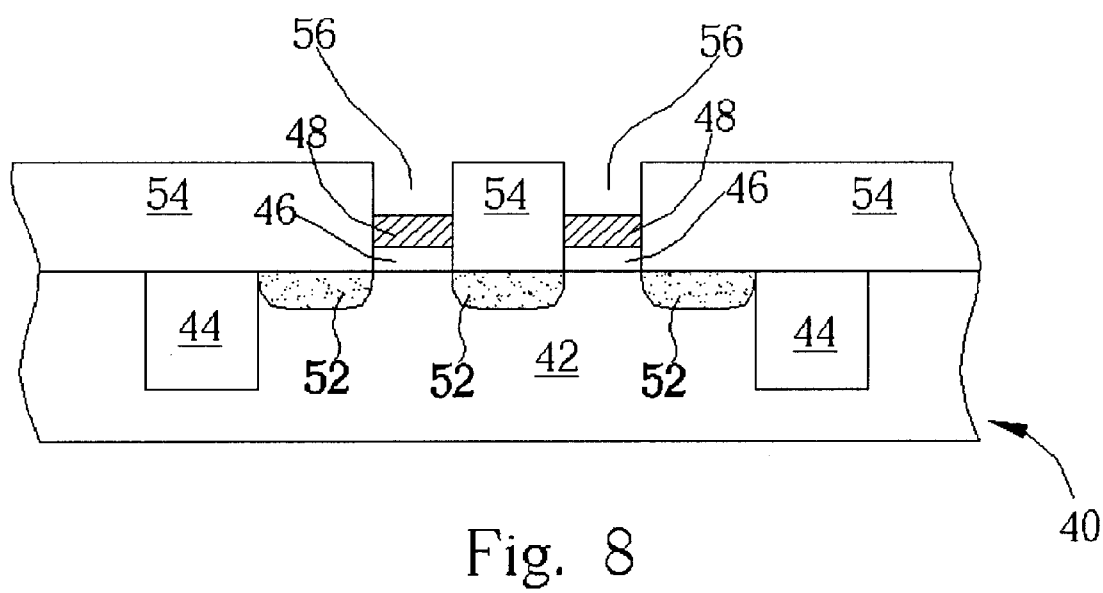
Figure 9:
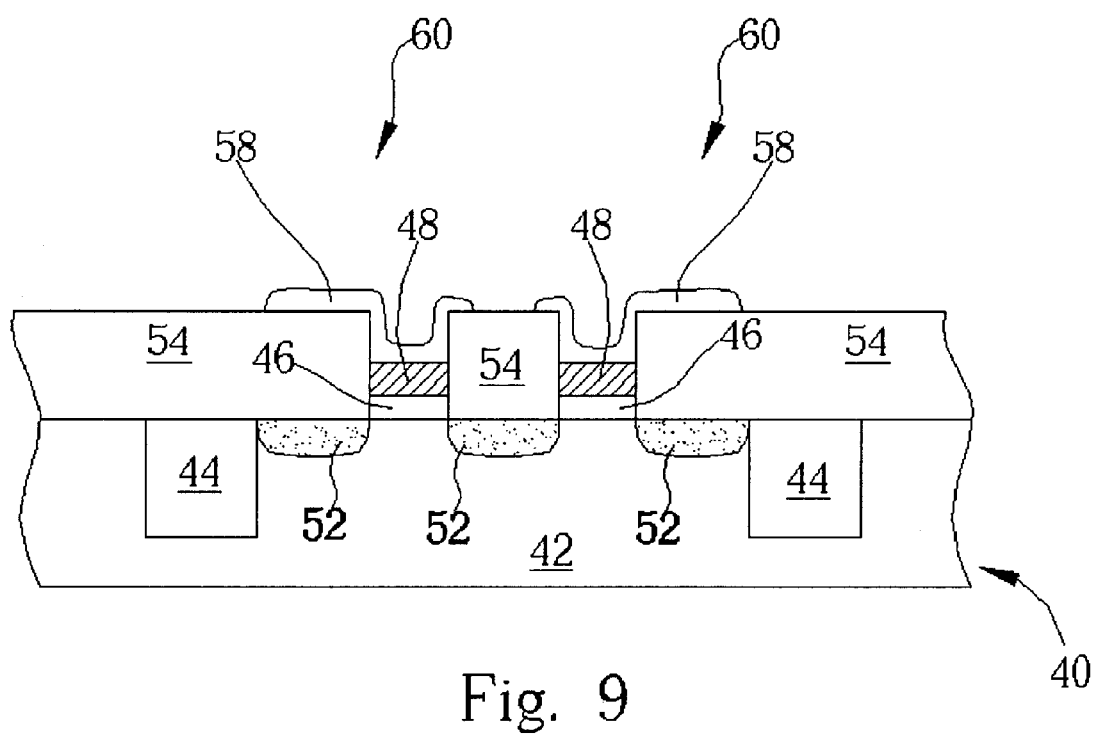

The sacrificial layer 50 is totally removed from the polysilicon layer 48 to form a recess 56. The polysilicon layer 48 forms the bottom of the recess 56 and the dielectric layer 54 forms the walls of the recess 56, as shown in FIG. 8. Then a polysilicon layer 58 is formed in a predetermined area on the surface of the semiconductor wafer 40 to complete the three-dimensional polysilicon layer 60, as shown in FIG. 9. The polysilicon layer 58 fills the recess 56 and electrically connects to the polysilicon layer 48. The dielectric layer 54 adjacent to the polysilicon layer 48 serves as a buried drain/source (BD/BS) and the polysilicon layer 58 serves as a floating gate, or as a storage node of a capacitor device.

Figure 10:
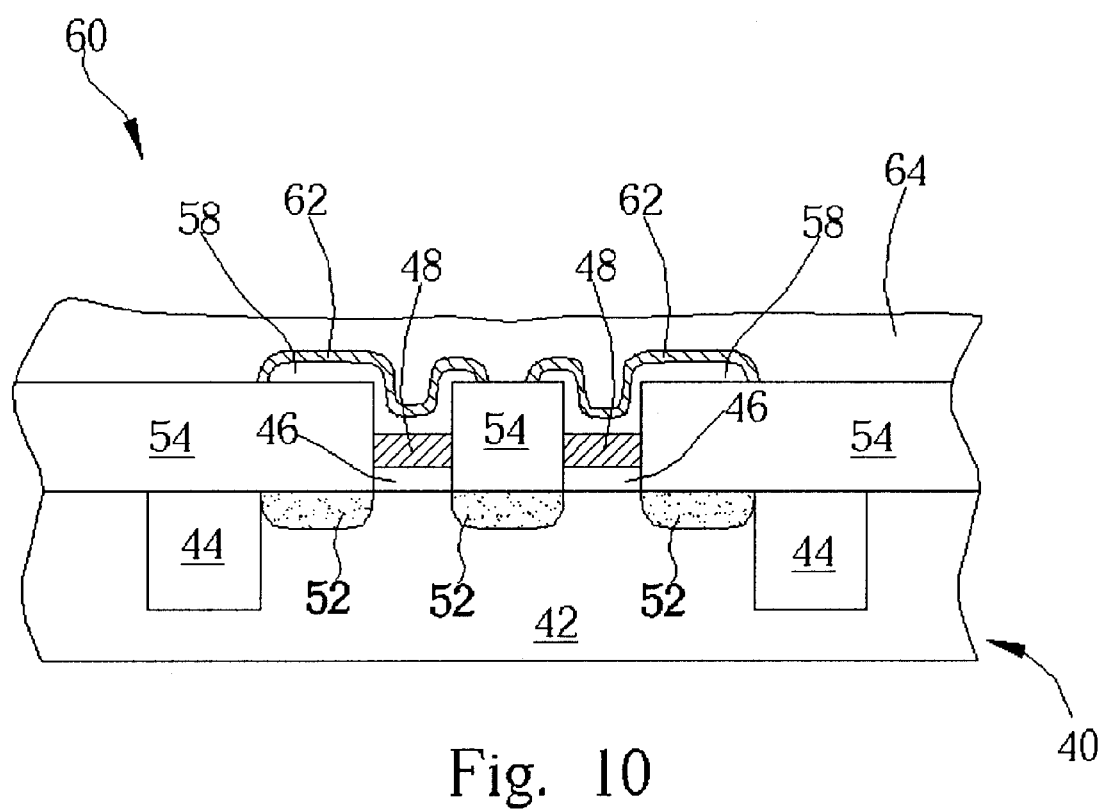
FIG. 10 is a cross-sectional diagram of forming a stack-gate on the semiconductor wafer of FIG. 9 according to the present invention.

Please refer to FIG. 10. FIG. 10 is a cross-sectional diagram of forming a stack-gate on the semiconductor wafer 40 of FIG. 9 according to the present invention. After the floating gate is completed, an insulating layer 62 is formed of ONO (oxide-nitride-oxide) on the surface of the polysilicon layer 58 and a polysilicon layer 64 serving as a control gate is then formed on the surface of the semiconductor wafer 40. The insulating layer 62 is formed by stacking in order silicon oxide, silicon nitride, and silicon oxide. The floating gate, the dielectric layer 62 and the control gate together constitute the stack-gate of the non-volatile memory and two stack-gates between the filed oxide 44 form the twin cell gate.

According to the present invention, the dielectric layer 54 formed by the HDP CVD process around the polysilicon layer 48 replaces the thermal oxide layer formed by thermal oxidation process of the prior art. Because the thickness of the BD/BS is precisely controlled by the HOP CVD process, the electrical performance of each stack-gate on the surface of the semiconductor wafer 40 is ensured. Additionally, the present invention planarizes the dielectric layer 54 around the polysilicon layer 48 by performing a CMP process and then removes the sacrificial layer 50 on the polysilicon layer 48 to form the recesses 56. Because the surface of the polysilicon layer 58 follows the shape of the recess 56 to form a three-dimensional structure that increases the contact area between the dielectric layer 62 and the control gate, raises the coupling ratio of the floating gate.

Figure 11:
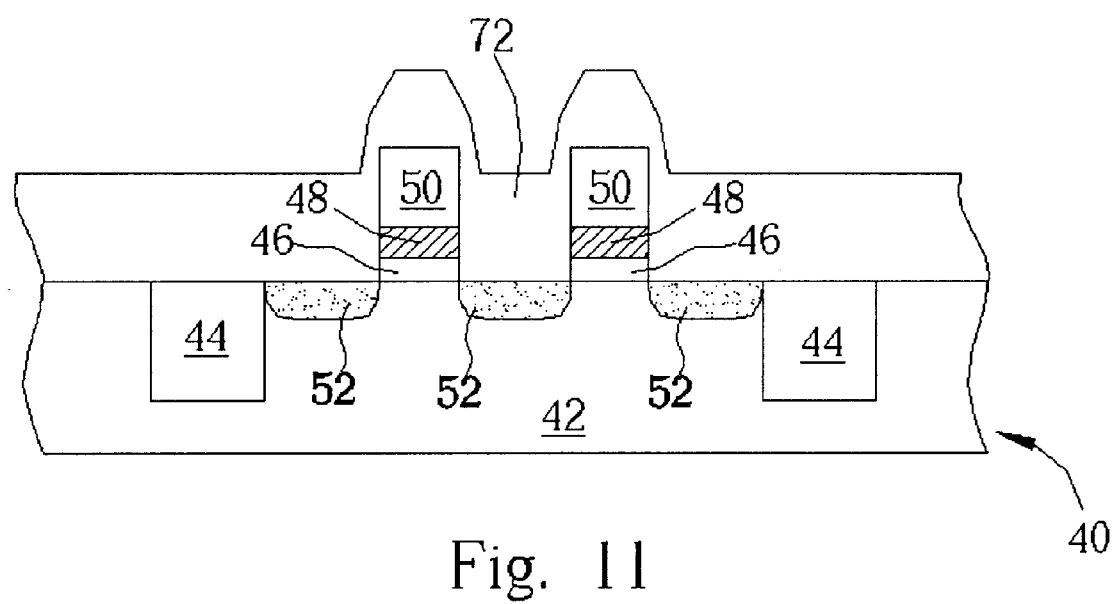
FIG. 11 to FIG. 16 are cross-sectional diagrams of an alternative embodiment of forming a three-dimensional polysilicon layer according to the present invention.
Figure 12:
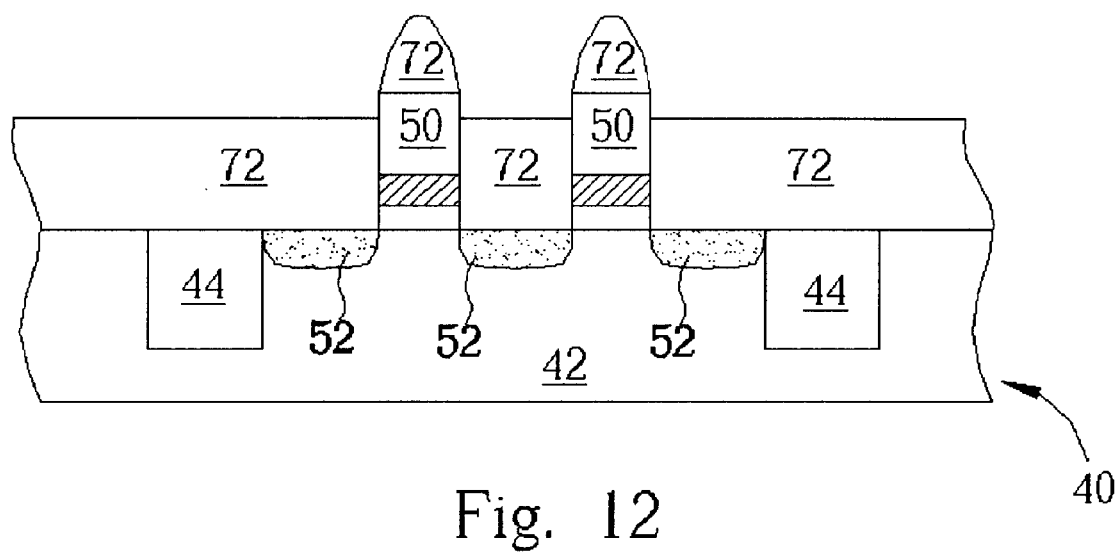

Please refer to FIG. 11 to FIG. 16. FIG. 11 to FIG. 16 are cross-sectional diagrams of an alternative embodiment of forming a three-dimensional polysilicon layer 80 according to the present invention. The three-dimensional polysilicon layer is formed on the surface of the semiconductor wafer 40. According to the present invention, a dielectric layer 72 is formed of silicon oxide on the surface of the semiconductor wafer 40 by performing a HDP CVD process. The dielectric layer 72 covers the substrate 42 and the sacrificial layer 50. The top surface of the dielectric layer 72 on the surface of the substrate 42 is above the top surface of the polysilicon layer 48 and below the top surface of the sacrificial layer 50, as shown in FIG. 11. A wet etching process is then performed to remove the dielectric layer 72 from an upper portion of the walls of the sacrificial layer 50, as shown in FIG. 12. The etching solution is dilute hydrofluoric acid (DHF) or buffered oxide etcher (BOE).

Figure 13:
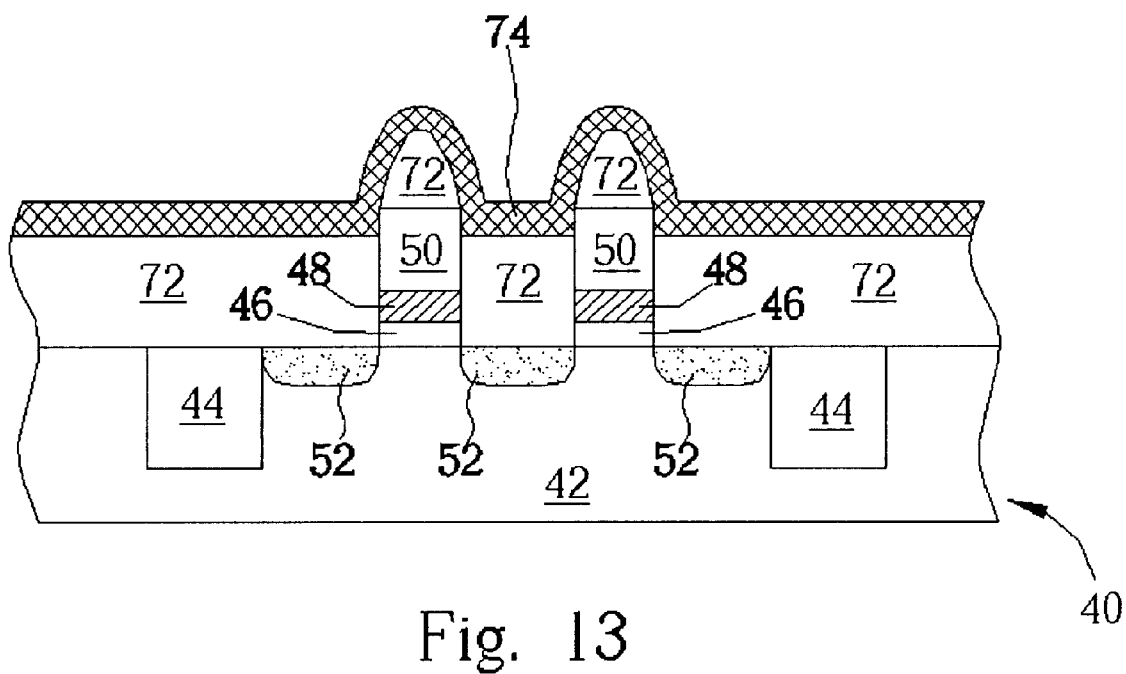
Figure 14:
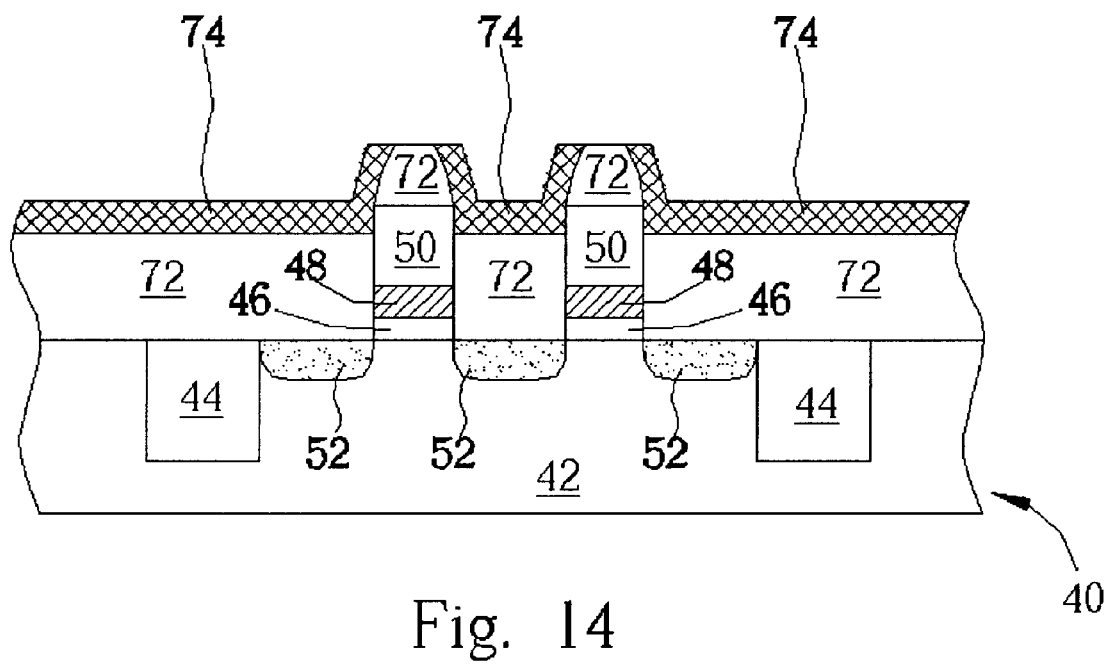
Figure 15:
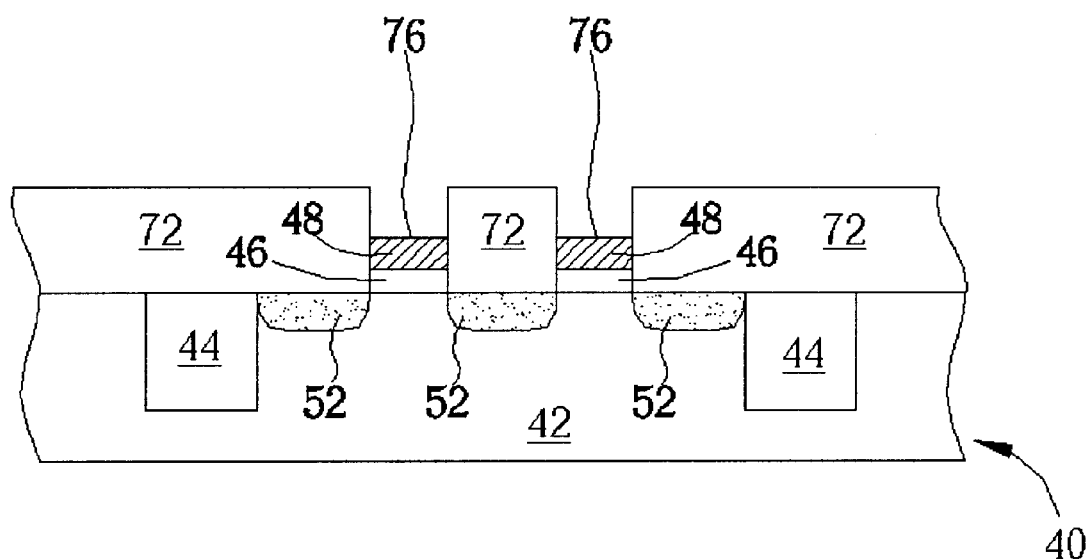
Figure 16:
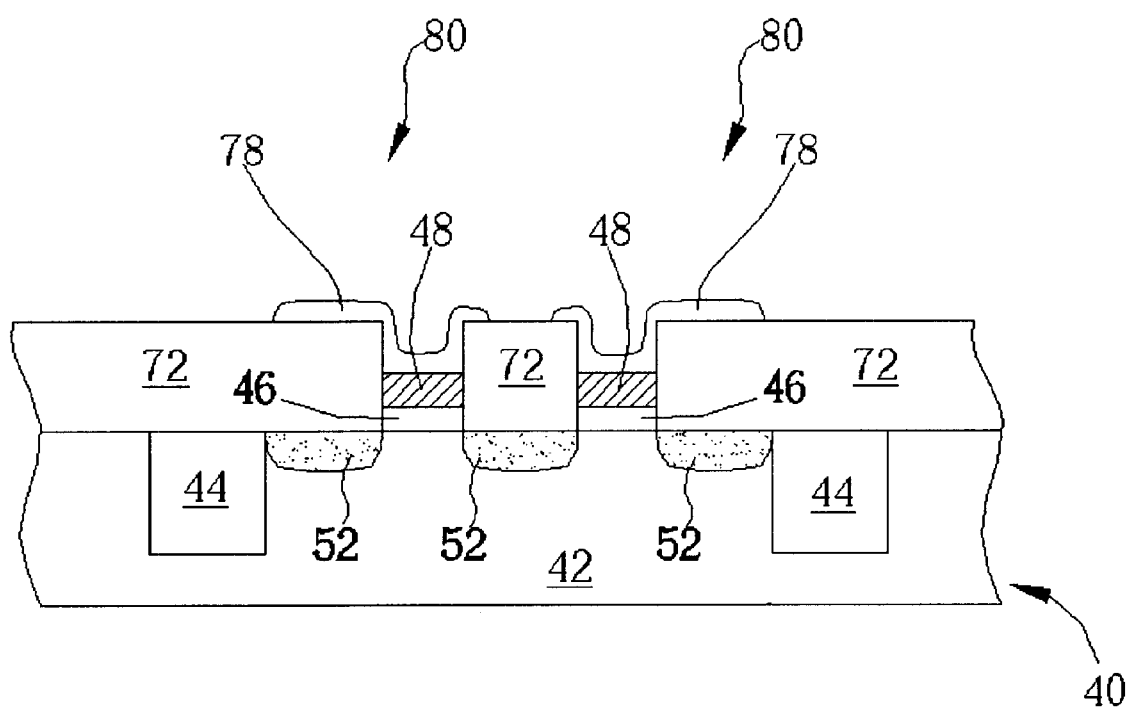

A passivation layer 74 is formed of silicon nitride on the surface of the dielectric layer 72. The passivation layer 74 contacts the exposed walls of the upper portion of the sacrificial layer 50, as shown in FIG. 13. A CMP process is then performed to remove both the dielectric layer 72 and the passivation layer 74 over the sacrificial layer down to a predetermined height, as shown in FIG. 14. After the dielectric layer 72 remove from the sacrificial layer 50, a wet etching process is performed to remove the passivation layer 74 from the surface of the semiconductor wafer 40 and remove the sacrificial layer 50 from the first polysilicon layer 48 to form a recess 76. The polysilicon layer 48 forms the bottom of the recess 76 and the dielectric layer 72 forms the walls of the recess 76, as shown in FIG. 15. Finally a polysilicon layer 78 is formed in a predetermined area on the surface of the semiconductor wafer 40 to form the floating gate so as to complete the polysilicon layer 80. The polysilicon layer 78 fills the recess 76, electrically connects to the polysilicon layer 48.

The present invention removes the dielectric layer 72 from the upper portion of the walls of the sacrificial layer 50 by performing a wet etching process and the forms the passivation layer 74 on the surface of the dielectric layer 72. Because the passivation layer 74 effectively prevent the exposed area on the surface of the semiconductor wafer 40 from the over polishing of the CMP process, the thickness of the dielectric layer 72 around the polysilicon layer 48, the thickness of the BD/BS, is ensured. Moreover, the surface of the dielectric layer 72 is prevented from the pollution of a polishing slurry or a metal contamination during the CMP process by the passivation layer 74.

The method of forming the three-dimensional polysilicon layer 60 can not only be applied on the fabrication of the non-volatile memory, but also can be used to form the storage node of an embedded flash or a dynamic random access memory.

In contrast to the prior art method of forming the polysilicon layer 28, the present invention of forming the three-dimensional polysilicon layer 80 comprises the following steps: performing a HDP CVD process to form a dielectric layer 54 serving as the BD/BS around the polysilicon layer 48; performing a CMP process to planarize the surface of the dielectric layer 54; and performing an etching process to form the recess 56 by removing the sacrificial layer 50 on the polysilicon layer 48. The surface of the subsequent formed polysilicon layer 58 follows the shape of the recess 56 to form a three-dimensional structure that increases the contact area between the ONO dielectric layer and the control gate, raising the coupling ratio of the floating gate. In the alternative embodiment of forming the three-dimensional polysilicon layer 80 according to the present invention, the passivation layer 74 is formed on the surface of the dielectric layer 72 before the CMP process is performed. The thickness of the dielectric layer 72 around the polysilicon layer 48, the thickness of the BD/BS, is effectively controlled and the surface of the dielectric layer 72 is prevented from the pollution of a polishing slurry or a metal contamination during the CMP process by the passivation layer 74.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of forming a three-dimensional polysilicon layer on a semiconductor wafer, the semiconductor wafer comprising:
    a substrate;
    a first polysilicon layer positioned in a predetermined area on the surface of the substrate, the first polysilicon layer having an approximately rectangular cross-section; and
    a sacrificial layer positioned on the first polysilicon layer;
    the method comprising:
        forming a dielectric layer on the surface of the semiconductor wafer, the dielectric layer covering the substrate and the sacrificial layer, the top surface of the dielectric layer on the surface of the substrate being above the top surface of the first polysilicon layer and below the top surface of the sacrificial layer;
        removing the dielectric layer from an upper portion of the walls of the sacrificial layer;
        forming a passivation layer on the surface of the dielectric layer, the passivation layer contacting the exposed walls of the upper portion of the sacrificial layer;
        performing a chemical mechanical polishing process to remove both the passivation layer and the dielectric layer over the sacrificial layer down to a predetermined height;
        removing the dielectric layer from the sacrificial layer;
        removing the passivation layer from the surface of the semiconductor wafer and removing the sacrificial layer from the first polysilicon layer to form a recess, the first polysilicon layer forming the bottom of the recess, and the dielectric layer forming the walls of the recess; and
        forming a second polysilicon layer in a predetermined area on the surface of the semiconductor wafer to complete the three-dimensional polysilicon layer, the second polysilicon layer filling the recess and electrically connecting to the first polysilicon layer.

2. The method of claim 1 wherein the dielectric layer is formed of silicon oxide by performing a high-density plasma chemical vapor deposition (HDP CVD) process.

3. The method of claim 2 wherein the method of removing the dielectric layer is a wet etching process, and the etching solution is dilute hydrofluoric acid (DHF) or buffered oxide etcher (BOE).

4. The method of claim 1 wherein the sacrificial layer and the passivation layer are formed of silicon nitride.

5. The method of claim 4 wherein the method of removing the passivation layer from the surface of the semiconductor wafer and removing the sacrificial layer from the first polysilicon layer comprises a wet etching process that uses heated phosphoric acid as the etching solution.

6. The method of claim 1 wherein the substrate is formed of silicon.

7. The method of claim 1 wherein the three-dimensional polysilicon layer serves as a floating gate, or as a storage node of a capacitor device.

8. The method of claim 7 wherein the surface of the substrate further comprises a doped area adjacent to each side of the first polysilicon layer, the two doped areas serving as a source and a drain of the floating gate.

9. A method of increasing a gate coupling ratio of a floating gate formed on a semiconductor wafer, the semiconductor wafer comprising:
    a substrate;
    a first polysilicon layer positioned in a predetermined area on the surface of the substrate, the first polysilicon layer having an approximately rectangular cross-section; and
    a sacrificial layer positioned on the first polysilicon layer;
    the method comprising:
        forming a dielectric layer on the surface of the semiconductor wafer, the dielectric layer covering the substrate and the sacrificial layer, the top surface of the dielectric layer on the surface of the substrate being above the height of the first polysilicon layer and below the top surface of the sacrificial layer;
        removing the dielectric layer from an upper portion of the walls of the sacrificial layer;
        forming a passivation layer on the surface of the dielectric layer, the passivation layer contacting the exposed walls of the upper portion of the sacrificial layer;
        performing a chemical mechanical polishing process to remove both the passivation layer and the dielectric layer over the sacrificial layer down to a predetermined height;
        removing the dielectric layer from the sacrificial layer;
        removing the passivation layer from the surface of the semiconductor wafer and removing the sacrificial layer from the first polysilicon layer to form a recess, the first polysilicon layer forming the bottom of the recess, and the dielectric layer forming the walls of the recess;

forming a second polysilicon layer in a predetermined area on the surface of the semiconductor wafer to form the floating gate, the second polysilicon layer filling the recess and electrically connecting to the first polysilicon layer; and forming an insulating layer on the surface of the floating gate;

wherein the surface of the second polysilicon layer follows the shape of the recess to form a three-dimensional structure that increases the contact area between the insulating layer and the control gate, raising the coupling ratio of the floating gate.

10. The method of claim 9 wherein the dielectric layer is formed of silicon oxide by performing a high-density plasma chemical vapor deposition (HDP CVD) process, and the method of removing the dielectric layer comprises a wet etching process that uses dilute hydrofluoric acid (DHF), or buffered oxide etcher (BOE), as the etching solution.

11. The method of claim 9 wherein the sacrificial layer and the passivation layer are formed of silicon nitride.

12. The method of claim 11 wherein the method of removing the passivation layer from the surface of the semiconductor wafer and removing the sacrificial layer from the first polysilicon layer comprises a wet etching process that uses heated phosphoric acid as the etching solution.

13. The method of claim 9 wherein the surface of the substrate further comprises a doped area adjacent to each side of the first polysilicon layer, the two doped areas serving as a source and a drain of the floating gate.

14. The method of claim 9 wherein the insulating layer is formed by stacking in order silicon oxide, silicon nitride, and silicon oxide.

* * * * *